United States Patent [19]

Sabah

[11] Patent Number: 5,284,095
[45] Date of Patent: Feb. 8, 1994

[54] COMPARTMENT FOR ELECTRIC CIRCUITS

[75] Inventor: Jacques Sabah, Vincennes, France

[73] Assignee: Societe Anonyme de Telecommunications, Paris, France

[21] Appl. No.: 840,763

[22] Filed: Feb. 24, 1992

[30] Foreign Application Priority Data

Feb. 27, 1991 [FR] France ................. 9102335

[51] Int. Cl.⁵ .................. F42B 30/00; H05K 7/20
[52] U.S. Cl. .................. 102/293; 165/13; 244/117 A; 244/118.1; 244/158 A; 361/704
[58] Field of Search .................. 102/293; 244/117 A, 244/158 A, 118.1; 361/386, 386/389; 165/13

[56] References Cited

U.S. PATENT DOCUMENTS

| 4,298,905 | 11/1981 | Bosler et al. | 361/386 |
| 4,414,605 | 11/1983 | Chino et al. | 361/388 |
| 4,462,462 | 7/1984 | Meagher et al. | 361/386 |
| 4,674,704 | 6/1987 | Altoz et al. | 244/117 A |
| 4,922,381 | 5/1990 | Longerich et al. | 361/381 |
| 4,971,570 | 11/1990 | Tolle et al. | 361/388 |
| 5,060,115 | 10/1991 | Sewell | 361/388 |

Primary Examiner—Harold J. Tudor
Attorney, Agent, or Firm—Hecker & Harriman

[57] ABSTRACT

Enclosure of reception of electronic components is embarked in a missile. The missile is first fixed to an aircraft carrier and to follow a carried flight, then after being fired, to follow a free flight. The enclosure is located inside of an exterior casing. Sectors sensitive to the acceleration are provided, on this side of a given acceleration, in order to form a thermal bridge between the enclosure and the casing and, beyond the given acceleration in free flight, to break that thermal bridge and to insulate the enclosure from the exterior. In free flight, the electronic components of the enclosure are no longer subject to a source of thermal energy.

9 Claims, 1 Drawing Sheet

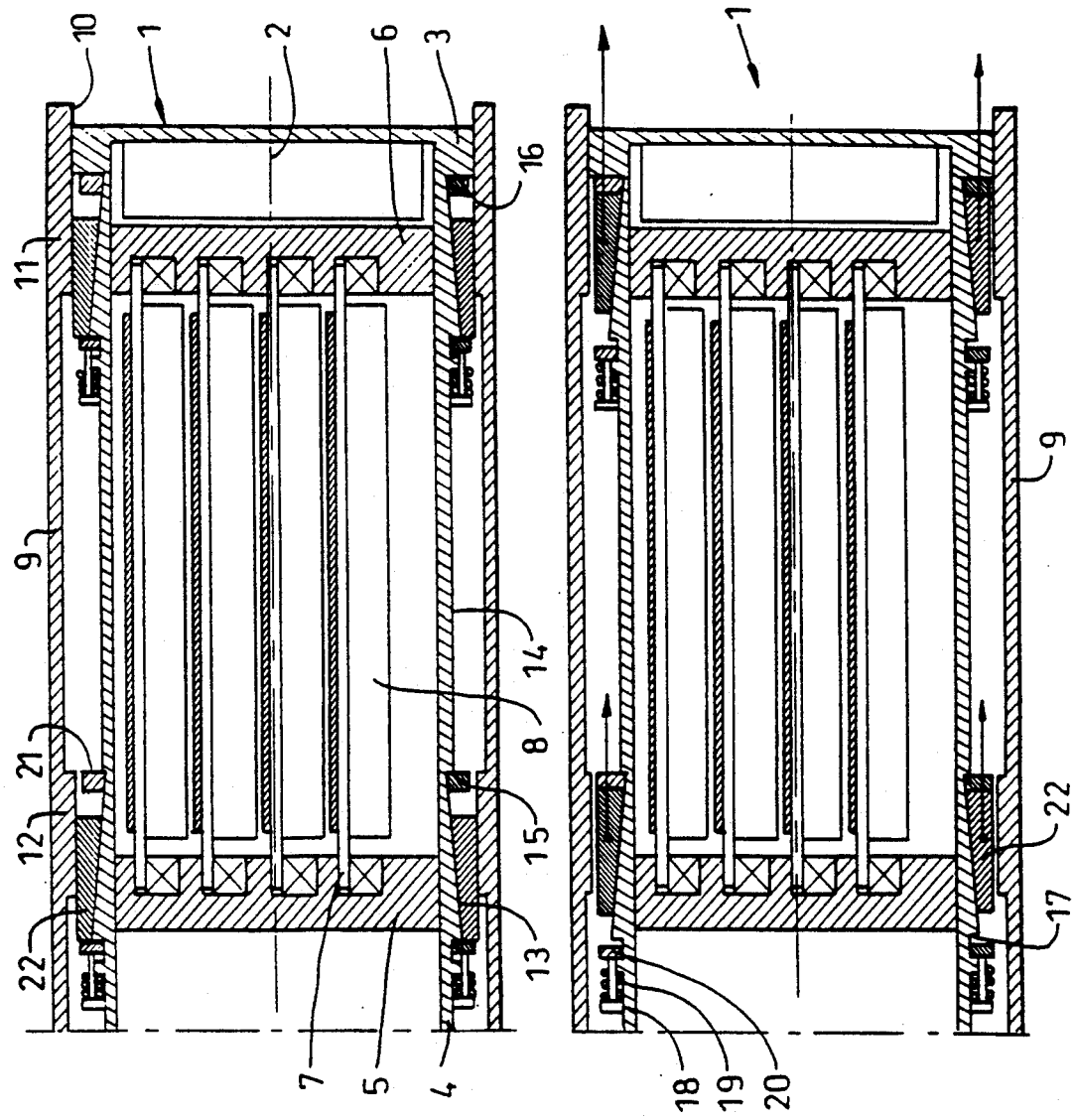

COMPARTMENT FOR ELECTRIC CIRCUITS

BACKGROUND OF THE INVENTION

1. Field of the Invention

The present invention provides an enclosure for reception of electronic components loaded upon a missile, to be first fixed to a carrying aircraft and to follow a carried flight, then, after being fired, to follow a free flight.

2. Background Art

Free-flying missiles often include electronic components stored in a receptacle or enclosure of the missile. During operation of these electronic components, heat is generated. A heat sink is required to remove the heat from the electrical components to prevent failure. Often, missiles are first carried aloft, such as by an aircraft, and subsequently fired for free-flight operation separate from the aircraft. During the carried flight, the exterior of the missile acts as a cold source; therefore, the heat generated by the electrical components can be discharged by the enclosure. By contrast, in free flight, after the missile has been fired from the carrying aircraft, the exterior of the missile acts like a heat source. Therefore, the heat generated by the electrical components cannot be dissipated by the enclosure. In fact, the electrical components are subject to an outside source of thermal energy in addition to the heat generated by the operation of the components themselves. It is desirable to provide a method of dissipating heat generated by electrical components on a missile while the missile is in free flight and during carried flight, as well.

SUMMARY OF THE INVENTION

The present invention describes an enclosure for electrical components for use in a host missile, characterized by the fact that the enclosure is located in the interior of an outer layer or casing and is provided with means sensitive to acceleration of its host missile within a given threshold acceleration, to form a thermal bridge between the enclosure and the casing, and above the given threshold acceleration, to break this thermal bridge and to insulate the enclosure from the exterior.

The acceleration above which the thermal bridge is broken, corresponds to that which acts upon the missile. Thus, during the firing, in the course of which the close exterior acts like a heat source, the enclosure is insulated from the exterior and the heat of the components can be discharged while in free flight. The enclosure and the exterior casing are thermally linked in carried flight.

The present invention takes into account the concomitant reversal of performance of the missile's exterior environment with the sudden acceleration acting upon it at the moment of the firing.

In a current model, the means sensitive to the acceleration include sectors in the form of wedges. Each sector is mounted in a mobile manner upon at least one inclined ramp of the enclosure between a forward position of the thermal bridge and a backward position of insulation.

In the preferred embodiment, the enclosure includes means for recalling the sectors into a bridging position and means for maintaining the sectors in an insulated position. The means for recalling the sectors is being, preferably, elastic recall means.

Again, in the better design, the sectors are made of metal. The recall means and the maintenance means are equipped with magnets. In the preferred embodiment, the recall means are provided with at least one piston on a spring to which a magnet is attached.

BRIEF DESCRIPTION OF THE DRAWINGS

The invention will be better understood with the aid of the following description of the preferred model of the enclosure of the invention, with reference to the design appended, on which:

FIG. 1 is a view of the longitudinal section of the enclosure in a position of carried flight; and FIG. 2 is a view of the longitudinal section of the enclosure in free flight.

DETAILED DESCRIPTION OF THE INVENTION

The enclosure 1 is depicted in FIGS. 1 and 2 in a generally cylindrical form of axis 2. However, the invention applies as well to enclosures in a general parallelepiped form.

The enclosure 1 includes a rear (or posterior) base 3 that extends toward the front by a skirt 4. Thermal guides 5 and 6 which are placed in the interior of skirt 4 for receiving electronic cards 7 on which are mounted components 8 having active components that discharge thermal energy during functioning.

The enclosure 1 is covered by an exterior casing 9 supported against the lateral wall of the base 3 by an internal surface 10. The diameter of innermost surface 10 is reduced by a rear pad 11 that extends toward the front beyond the base 3 of the enclosure 1.

The casing 9 has another pad 12 in the front of the enclosure 1. The pad 12 is of substantially the same internal diameter as the rear pad 11.

Facing pads 11,12 of the casing 9, the skirt 4 of the enclosure comprises external ramps 13 inclined rearwards from the outside to the inside and connected in their rear parts, at the front of the enclosure, to the lateral surface 14 of the skirt 4 by a shoulder 15 and, at the rear of the enclosure, to the base 3 by a shoulder 16. In their front part, ramps 13 are connected to the skirt 4 by another shoulder 17 which is, therefore, deeper than shoulders 15,16.

A magnet 21 is placed against each shoulder 15,16 between the enclosure 1 and the casing 9. Magnet 21 has an appropriate dimension in order not to form a thermal bridge between them. Spring pistons 18 with springs 19 are affixed on the skirt 4 ahead of shoulder 17. Magnets 20 are attached to the pistons 18 slightly ahead of shoulder 17.

A bridging and insulation metallic sector 22 is mounted between each pad 11,12 of the casing 9 and each inclined ramp 13 of the skirt 4 of the enclosure 1, in order to slide on the ramp 13. Sector 22 is wedge-shaped in longitudinal cross-section, complementary to the ramp, with a rear thickness less than the distance between the pad and the bottom of the rear connecting shoulder of the ramp, but greater than the front thickness. In the present example, the sliding of the sectors 22 on the ramps 13 is provided by means of straight guides, which have here a T cross-section, mounted on ramps 13, the sectors 22 being shaped in a complementary manner in transverse cross-section.

In the present example, the sectors 22 are annular sectors angularly extending over two inclined ramps 13.

During carried flight, in the absence of pronounced acceleration, the sectors 22 are returned toward the front by the pistons 18 and magnets 20 which attract them. In this forward position, the sectors 22 form a thermal bridge between the enclosure 1 and its exterior casing 9. The thermal energy discharged by the components 9 can be dissipated through a path crossing the thermal guides 6, the skirt 4 and the casing 9.

Note that the springs 19 of the pistons 18 allow, during a carried flight, the absorption of the accelerations that are less than the acceleration of the firing of the missile. Sectors 22 rest flatly against the pads 11 and 12 of the casing 9 under the influence of the magnets 20. Magnet 20 has a force of attraction that is greater than the force of repulsion caused by the accelerations of the carrier aircraft.

The firing of the missile subjects the enclosure 1 and the casing 9 to such an acceleration that the sectors 22 escape the attractive force of the magnets 20 and recoil toward the back sliding on the slide channels of the ramps 13 in order to break the thermal bridging, thereby forming a wave of air between the enclosure 1 and the casing 9, and finally to insulate one from the other. Having escaped the attractive force of the front magnets 20, the sectors 22 at the end of the course are attracted by the magnets in the back 15 which keep them in a backward position of insulation during the free flight.

I claim:

1. An enclosure of reception of electronic components embarked aboard a missile to be first fixed to a carrying aircraft and to follow a carried flight, then after being fired, to follow a free flight, said enclosure being located inside an outer casing and means sensitive to acceleration are provided for, within a given acceleration, to form a thermal bridge between said enclosure and said casing, and beyond said given acceleration, to break said thermal bridge and to insulate said enclosure from said casing.

2. The enclosure according to claim 1 in which said means sensitive to said acceleration include sectors in the form of wedges, each of said sectors mounted in a mobile manner upon at least one inclined ramp of said enclosure, between a forward position of said thermal bridge and a backward position of insulation.

3. The enclosure according to claim 2 wherein returning means are provided for returning said sectors in a bridging position.

4. The enclosure according to claim 3 wherein said returning means comprises elastic returning means for absorbing said accelerations of said carrying aircraft.

5. The enclosure according to claim 2 wherein maintenance means are provided for maintaining said sectors in a position of insulation.

6. The enclosure according to claim 5 wherein said maintenance means comprises magnets.

7. The enclosure according to claim 4 wherein said returning means comprises at least a piston with a spring.

8. The enclosure according to claim 3 wherein said returning means comprises magnets.

9. The enclosure according to claim 7 wherein a magnet is attached to said spring of said piston.

* * * * *